US012713679B2

(12) United States Patent
Ferrara et al.

(10) Patent No.: US 12,713,679 B2
(45) Date of Patent: Aug. 18, 2026

(54) SEMICONDUCTOR DEVICE AND METHOD OF MANUFACTURING THE SAME

(71) Applicant: Infineon Technologies Austria AG, Villach (AT)

(72) Inventors: Alessandro Ferrara, Villach (AT); Gerhard Thomas Nöbauer, Villach (AT)

(73) Assignee: Infineon Technologies Austria AG, Villach (AT)

( * ) Notice: Subject to any disclaimer, the term of this patent is extended or adjusted under 35 U.S.C. 154(b) by 514 days.

(21) Appl. No.: 18/226,321

(22) Filed: Jul. 26, 2023

(65) Prior Publication Data

US 2024/0055490 A1 Feb. 15, 2024

(30) Foreign Application Priority Data

Aug. 9, 2022 (EP) .................................... 22189507

(51) Int. Cl.

*H10D 64/00* (2025.01)
*H10D 64/01* (2025.01)
*H10W 20/00* (2026.01)
*H10W 20/42* (2026.01)

(52) U.S. Cl.

CPC ........... *H10D 64/117* (2025.01); *H10D 64/01* (2025.01); *H10W 20/01* (2026.01); *H10W 20/42* (2026.01)

(58) Field of Classification Search

CPC .. H10D 64/112; H10D 62/127; H10D 64/117; H10D 64/01; H10D 30/668; H10D 84/141; H10D 12/481; H01L 21/768; H01L 23/5226; H10W 20/01; H10W 20/42

See application file for complete search history.

(56) References Cited

U.S. PATENT DOCUMENTS

| | | | | |
|---|---|---|---|---|
| 5,973,360 | A * | 10/1999 | Tihanyi | H10D 30/668 257/330 |
| 8,829,624 | B2 | 9/2014 | Gladish et al. | |
| 9,048,116 | B2 | 6/2015 | Rutter et al. | |
| 9,722,036 | B2 * | 8/2017 | Hirler | H02M 7/003 |
| 11,133,391 | B2 * | 9/2021 | Hirler | H10D 64/513 |
| 2010/0163950 | A1 | 7/2010 | Gladish et al. | |
| 2013/0146972 | A1 | 6/2013 | Rutter et al. | |
| 2013/0193502 | A1 | 8/2013 | Kocon et al. | |

(Continued)

FOREIGN PATENT DOCUMENTS

| | | |
|---|---|---|
| EP | 3343638 A1 | 7/2018 |

*Primary Examiner* — Galina G Yushina

(74) *Attorney, Agent, or Firm* — Murphy, Bilak & Homiller, PLLC

(57) ABSTRACT

The present application relates to a semiconductor device, including: a field electrode in a needle-shaped field electrode trench extending from a frontside of a semiconductor body into the semiconductor body; a lower metallization layer on the frontside of the semiconductor body and electrically connected to the field electrode; an insulating layer on the lower metallization layer; an upper metallization layer on the insulating layer, and a first interconnect electrically connecting the lower metallization layer to the upper metallization layer. The first interconnect is laterally offset to the field electrode trench. The lower metallization layer is not connected to the upper metallization layer in a region vertically above the field electrode trench.

19 Claims, 7 Drawing Sheets

(56) References Cited

U.S. PATENT DOCUMENTS

2015/0333060 A1* 11/2015 Decker .................. H10D 30/63
257/392
2017/0062412 A1 3/2017 Kawano et al.
2017/0104078 A1* 4/2017 Laforet ................ H10D 30/668
2017/0250256 A1* 8/2017 Siemieniec .......... H10D 62/127
2019/0305092 A1* 10/2019 Blank .................. H10D 62/393
2020/0052077 A1* 2/2020 Altstaetter ........... H10D 84/038
2020/0212200 A1* 7/2020 Ghani .................. H10D 62/115
2022/0052164 A1* 2/2022 Haase .................. H10D 62/127

* cited by examiner

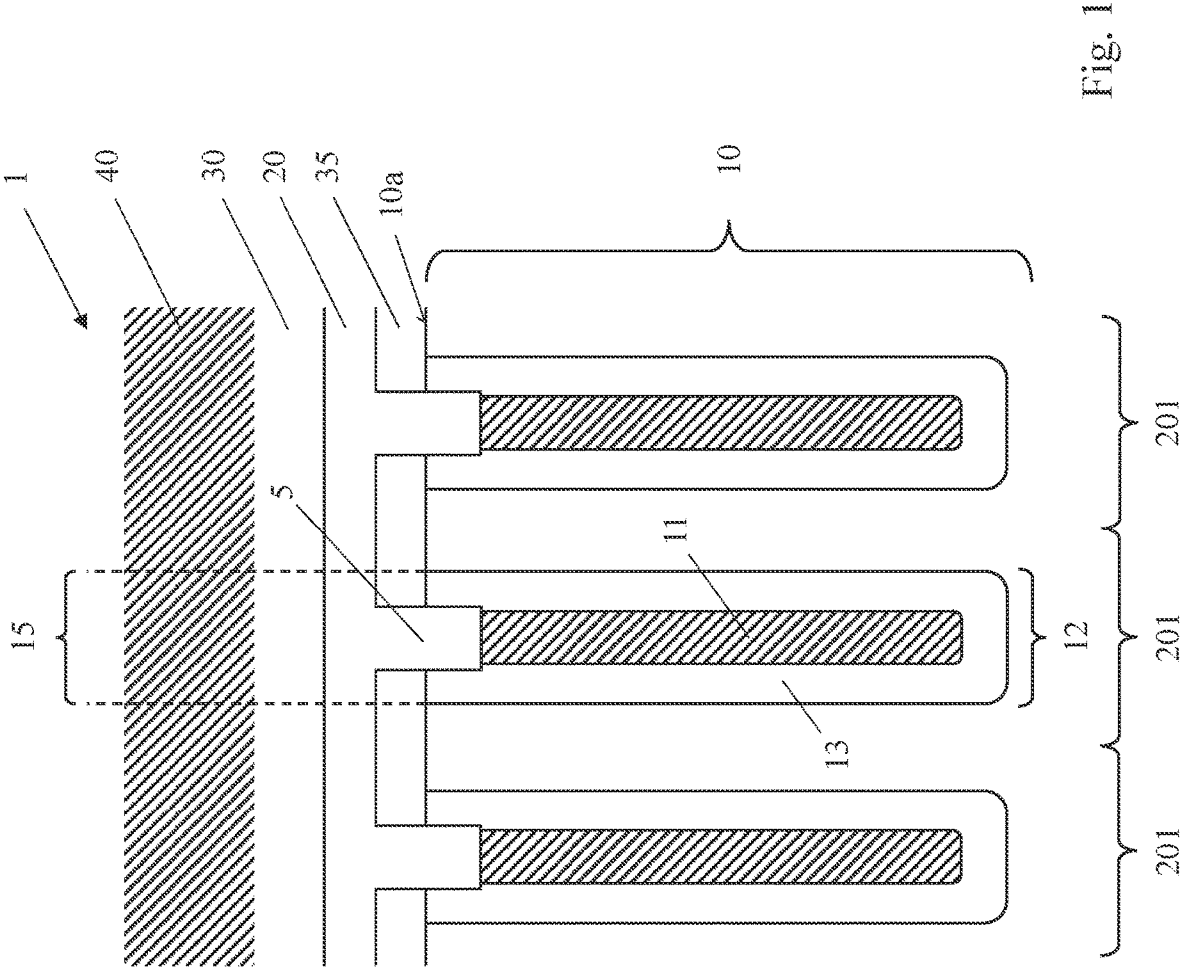
Fig. 1
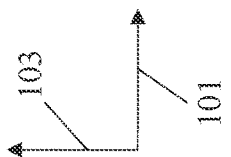

SEMICONDUCTOR DEVICE AND METHOD OF MANUFACTURING THE SAME

TECHNICAL FIELD

The present application relates to a semiconductor device comprising a field electrode in a trench.

BACKGROUND

As detailed below, the device can in particular be a vertical FET with a source and a drain region formed at opposite sides of a semiconductor body. Into this semiconductor body, a needle-shaped field electrode trench extends, in which a field electrode is disposed. The trench is etched from a frontside into the semiconductor body, and a metallization system is formed on the frontside to contact the field electrode.

SUMMARY

It is an object of the present application to provide a semiconductor device with improved properties, as well as a method of manufacturing such a device.

An electrical connection of the field electrode is realized in a metallization structure on the frontside of the semiconductor body, which comprises a lower and an upper metallization layer. An insulating layer is arranged vertically between these metallization layers, isolating them from each other apart from one or more interconnects formed between the metallization layers. The field electrode is electrically connected to the lower metallization layer, e.g. via a lower vertical interconnect laterally aligned with the field electrode, and the lower metallization layer is electrically connected to the upper one via a first (upper) interconnect. This first interconnect is laterally offset to the field electrode trench, so that no electrical connection is formed between the metallization layers in a region vertically above the field electrode trench.

By not connecting the metallization layers directly above the field electrode trench and arranging the first interconnect with the lateral offset instead, the resistance of the electrical connection to the field electrode can be increased. This can, e.g. in case of a transistor device with the upper metallization layer serving as a source metallization to which the fled electrode is connected, result in an increased resistance $R_{OSS}$ between source and the field electrode (e.g. in comparison to a source connection extending vertically straight up). Increasing the output resistance $R_{OSS}$ can be advantageous with respect to overshoot events, e.g. reduce voltage overshoots during switching events.

Particular embodiments and features are provided in this description and in the dependent claims. Therein, the individual features shall be disclosed independently of a specific claim category, the disclosure relates to apparatus and device aspects, but also to method and use aspects. If for instance a device manufactured or used in a specific way is described, this is also a disclosure of a respective manufacturing process or method of using, and vice versa. In general words, an approach of this application is to place a vertical interconnect between metallization layers formed above a field electrode with a lateral offset to the field electrode, to increase the conductor line length through the metallization layers upwards and the resistance, thus. In particular, the lower and the upper metallization layer can be isolated from each other in the region vertically above the field electrode trench, in particular they can be isolated from each other considering the device cell as a whole.

Due to the lateral offset, the first interconnect is not arranged in the region vertically above the field electrode trench. In the field electrode trench, which has a spicular or columnar shape, the field electrode region comprising the field electrode and the field dielectric is arranged, and the "region vertically above the field electrode trench" is the virtual upward extension of the field electrode region in the vertical direction. The lower metallization layer can extend above the field electrode trench in said region, and the upper metallization layer could generally even be interrupted there. In particular, however, the lower and the upper metallization layer can extend in said region above the field electrode trench, wherein the insulating layer is arranged in between and isolates the metallization layers from each other there.

The "vertical" direction lies perpendicular to a surface of the device, e.g. a frontside surface of the semiconductor body. "Lateral" or "laterally" refers to a lateral direction perpendicular to the vertical direction. For instance, the needle-shaped field electrode trench extends vertically into the semiconductor body, and laterally a plurality of field electrode trenches can be arranged aside each other. The device can in particular comprise a plurality of device cells, e.g. each having one field electrode trench centrally and/or a gate region circumscribing the cell, the device cells being for instance arranged in a matrix-like pattern.

The device, or a respective device cell, can for example comprise a source region at the frontside of the semiconductor body, e.g. adjacent to the insulating layer, and a drain region vertically opposite thereto, e.g. at the backside of the semiconductor body. The device can in particular be a vertical FET, even though an FET with a lateral gate or an IGBT would generally be conceivable as well. Adjacent to the source region of the vertical FET, e.g. vertically below, a body region comprising a channel region can be formed. The gate region can in particular be arranged laterally aside the body/channel region, for instance in a gate trench. The latter can extend into the semiconductor body from the frontside, it can for instance extend around the field electrode trench seen in a vertical top view. In this top view, the gate trench can for example have a rectangular, in particular quadratic, or hexagonal pattern, the device cells arranged respectively in the rectangular/quadratic or hexagonal pattern.

In the vertical direction, the field electrode trench can extend deeper into the semiconductor body than the gate trench. Vertically between the body region and the drain region, a drift region made of the same doping type but with a lower doping concentration than the drain region can be formed, and the field electrode trench can in particular extend into this drift region. The semiconductor body, in which doped regions are formed, can for instance comprise a semiconductor substrate and one or more epitaxial layers on this substrate.

In general, the device can comprise a third metallization layer, which can be arranged below the lower or above the upper metallization layer. Hence, the lower metallization layer can generally be connected to the field electrode not directly via the lower interconnect, but indirectly via an additional (third) metallization layer in between. In particular, however, the lower metallization layer can be the lowermost metallization layer connected to the field electrode via a lower interconnect aligned with the field electrode trench. Vice versa, the upper metallization layer can in particular be the uppermost metallization layer of the device.

In an embodiment, the lower and the upper metallization layer extend in the region above the field electrode trench, e.g. are not interrupted there but are isolated from each other, see the remarks above.

In an embodiment, the first (upper) interconnect is not only arranged outside the region above the field electrode trench, but even outside the respective device cell as a whole. In other words, no connection between the lower and the upper metallization layer is formed in the device cell, the first (upper) interconnect can be arranged in another device cell aside or laterally aside the cell field as a whole. Independently of these details, a plurality of device cells can be arranged matrix-like aside each other in the cell field, e.g. with a respective translational symmetry in a first and a second lateral direction. Depending on the cell layout and arrangement, the first and second lateral direction can lie oblique or in particular perpendicular to each other.

In an embodiment, a first conductor line is formed in the lower metallization layer and extends across the first device cell, e.g. across a plurality of device cells arranged aside each other, for example in the first lateral direction. The first conductor line can in particular have a lateral width smaller than a lateral width of the first device cell, allowing for instance for a device contact formation in the same lower metallization layer, e.g. a body/source wiring. In particular, the width of the first conductor line can be smaller than ½ or even ⅓ of the cell width. In the first lateral direction, the conductor line can have its length extension, the width of the conductor line and of the cell taken in the second lateral direction, e.g. perpendicular thereto. In view of different conductor lines formed in a respective metallization layer, "connected to a respective metallization layer means "connected to at least one conductor line" in the respective layer.

In an embodiment, a second conductor line is formed in the lower metallization layer aside the first conductor line and electrically connected to the device, see above. The second conductor line can serve as a source contact, in particular body/source contact, it is electrically isolated from the first conductor line, e.g. at least in the device cell. However, considering the device as a whole, the first and the second conductor line can be connected to each other, e.g. aside the cell field or via the upper metallization layer. Therein, the electrical contact of the second conductor line to source and/or body can be routed up directly, e.g. via a lower body/source contact to the lower metallization layer and via an upper body/source contact between the lower and the upper metallization layer, these interconnects arranged in the respective device cell. In contrast, the electrical connection between the first conductor line and the upper metallization layer is laterally displaced, which extends the conductor line length and increases the resistance, see above.

In an embodiment, a body and/or source contact of the device or respective device cell is interrupted in an interruption region below the first conductor line. In particular, the first conductor line can extend across the device cell, the source and/or body contact being interrupted in a first and a second interruption region at opposite sides of the device cell. Even though the source and/or body contact is interrupted, the body and source region can, seen in a vertical top view, surround the first field electrode completely.

In an embodiment, a high dose implant is disposed in the interruption region, made of the same doping type but with a higher doping concentration than the body region. The high dose implant can for instance be introduced after an annealing of the source implant, but before the contact etch of the body and/or source contact. Independently of these details, the high dose implant can for instance improve the avalanche robustness of the device, e.g. counteract a reduction of the snapback current resulting from the disconnection in the interruption region(s) (e.g. in case of an interruption region with a width of 600 nm, the snapback current can decrease from about 15 A/mm$^2$ to about 10 A/mm$^2$).

In an embodiment, which relates to a plurality of device cells disposed aside each other in the first lateral direction, the first (upper) interconnect is disposed in or even outside of a first outermost one of these cells ("first outermost cell"). In other words, it can be arranged in the outermost cell or even outside the cell field. A second (upper) interconnect electrically connecting the lower to the upper metallization layer can be disposed in or laterally outside of a second outermost one of these device cells (outside the cell field in the latter case), which is opposite to the first outermost device cells in the first lateral direction.

In a particular embodiment, the first conductor line (see above) extends across the plurality of device cells, e.g. as a straight line between the first and the second outermost device cell. Laterally aside, the second conductor line can extend across the device cells, e.g. forming the source and/or body wiring. Seen in a vertical top view, the first conductor line can be arranged in between second conductor lines, each of these second conductor lines forming a source and/or body wiring of the respective cells below.

In an embodiment, the first conductor line does not extend as a straight line across the device cells, but has curves and/or bends (e.g. U-turn bends). The first conductor line can in particular have a meandering extension when viewed in a vertical top view, e.g. have a plurality of sections parallel to each other, a respective section connected to the neighboring sections at its opposite ends via a respective U-turn bend. Independently of these details, this meander or snake-like conductor line pattern can increase the resistance further, the first interconnect can for instance be arranged at one end of this conductor line, e.g. in combination with a second (upper) interconnect at the opposite end, or be connected to the central portion of the conductor line.

In an embodiment, independently of whether extending as a straight line or with curves and bends, the first conductor line is covered by the insulating layer. In other words, the insulating layer extends as a continuous layer above the first conductor line, e.g. apart from the interconnect or interconnects at the end(s). Laterally aside, e.g. above the second conductor line or lines, the insulating layer can be interrupted by source/body contacts between the lower and upper metallization layer.

In an embodiment, the lower metallization layer is made of tungsten. This can allow for a fine structuring, e.g. of a wide coverage of a respective device cell by the first and second conductor line due to a comparable small spacing in between. Independently of the specific material, the metallization layer can have a smaller thickness compared to the upper metallization layer, the letter having for instance a thickness of not more than 0.8 μm or even 0.6 μm (with a possible lower limit of at least 0.1 μm), and the former having for example a thickness of at least 2 μm or 3 μm (and possible upper limits of not more than 20 μm, 15 μm or 10 μm).

The application relates also to a method for manufacturing a device disclosed here, comprising the steps:

i) forming the first field electrode;
ii) forming the lower metallization layer on the frontside of the semiconductor body;
iii) forming the insulating layer on the lower metallization layer;
iv) forming the first interconnect;

v) forming the upper metallization layer on the insulating layer.

Regarding further details, reference is also made to the description above. The device described here can in particular allow for a reuse of existing manufacturing steps, the first conductor line can in particular be formed in the same processing step like a gate conductor line, which contacts the gate region, in particular gate electrode of the device. In this respect again, the tungsten can be applied advantageously, allowing for a fine structuring and wiring. Alternatively or in addition, the first (upper) interconnect can be formed simultaneously with a contact interconnect (source and/or body contact) formed between the second conductor line and the upper metallization layer.

The application relates also to a use (method of using) of the semiconductor device in a switching or in particular drive application. Drive-optimized applications can be of a particular interest, because the avalanche robustness can be of a minor interest compared to voltage overshoot requirements there. The device can in particular be used in voltage classes of 100 V and more, because contact widths above 600 nm can be useful in view of the snapback characteristics.

BRIEF DESCRIPTION OF THE DRAWINGS

Below, the semiconductor device and method of manufacturing the same are explained in further detail by means of exemplary embodiments. Therein, the individual features can also be relevant for the disclosure in a different combination.

FIG. 1 shows a portion of a semiconductor device in a vertical cross-section;

DETAILED DESCRIPTION

Figure 2:
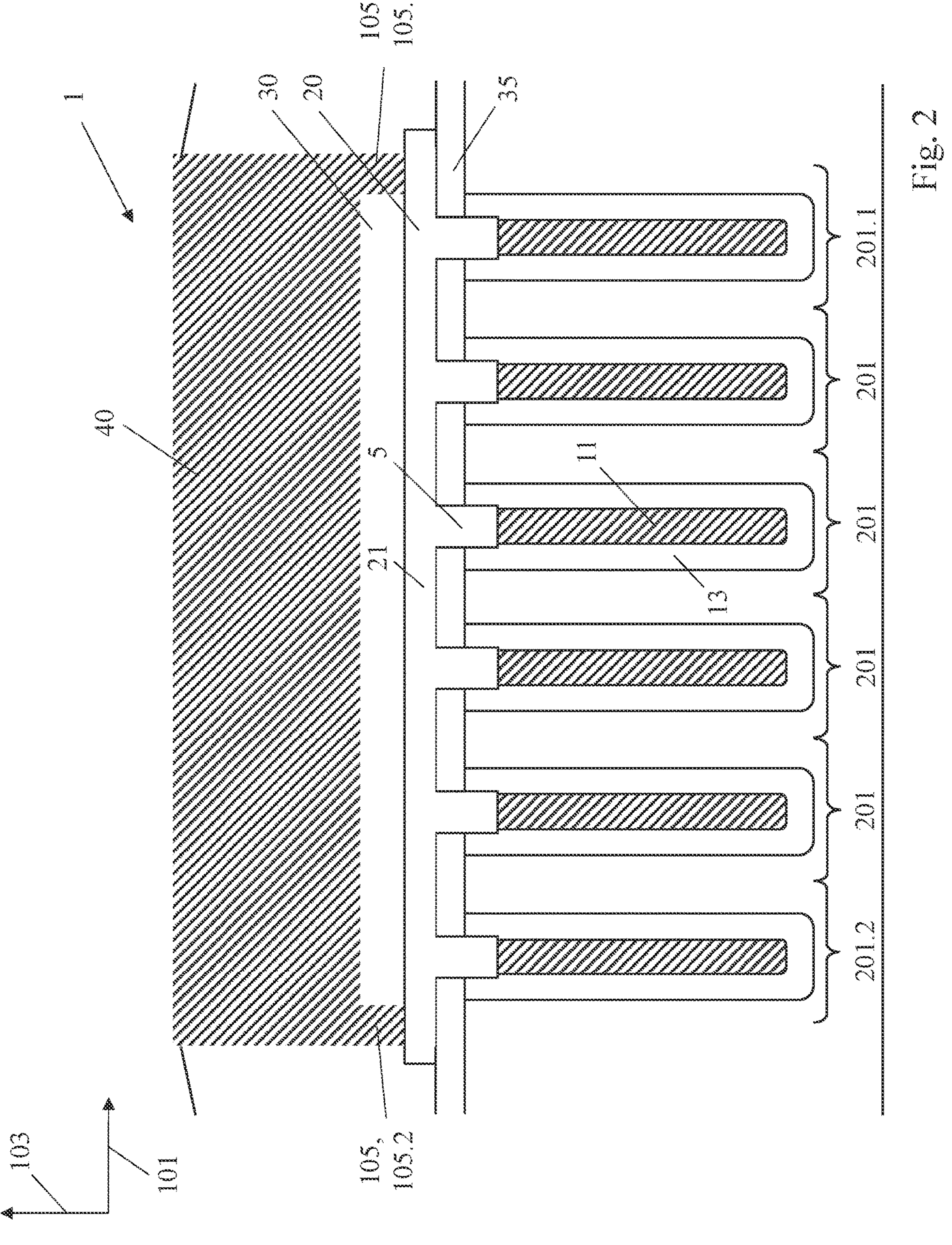
FIG. 2 illustrates a larger portion of the semiconductor device of FIG. 1, illustrating more device cells and wiring details of the metallization.

FIG. 1 illustrates a semiconductor device 1, namely a vertical FET comprising a plurality of device cells 201. The functioning of a respective device cell 201 will be explained with reference to FIG. 3 in detail below, in each device cell 201 a field electrode 11 in a needle-shaped field electrode trench 12 is formed (only referenced for the central device cell 201 in FIG. 1). The field electrode trench 12 extends from a frontside 10 a of semiconductor body 10 into the latter, and the field electrode 11 is made of a conductive material, e.g. polysilicon. It is electrically isolated from the surrounding semiconductor body 10 by a field dielectric 13, e.g. silicon oxide, which capacitively couples the field electrode 11 to the semiconductor body 10.

On the frontside 10*a* of the semiconductor body 10, a lower metallization layer 20 and an upper metallization layer 40 are formed. The lower metallization layer 20 is deposited onto a lower insulating layer 35, and an (upper) insulating layer 30 is arranged between the lower and the upper metallization layers 20, 40. In the example shown, the lower metallization layer 20 is made of tungsten, and the upper metallization layer 40 is made of aluminum and forms a source contact (see also FIG. 3). The field electrode 11 is electrically connected to the lower metallization layer 20 via a (lower) interconnect 5 extending through the lower insulating layer 35, e.g. a tungsten plug.

In the following, reference is also made to FIG. 2, which shows a larger portion of the device 1. As apparent from these cross-sectional views, even though the field electrode 11 is connected to the lower metallization layer 20 via the lower interconnect 5, this connection is not routed further upwards directly above the field electrode trench 12 or respective device cell 201, instead a respective first and second (upper) interconnect 105.1, 105.2 are displaced laterally. Due to this lateral offset of the upper interconnects 105, the effective conductor line length and, consequently, the resistance between the upper metallization layer 40 and the respective field electrode 11 is increased, which can be advantageous in case of overshoot events, see in detail above.

In the example shown in FIG. 2, the first interconnect 105.1 is formed in a first outermost device cell 201.1, and the second upper interconnect 105.2 is formed in a second outermost device cell 201.2. Alternatively, the upper interconnects 105 could even be arranged outside these outermost device cells 201.1, 201.2, see FIG. 4 for illustration. The first and the second outermost device cell 201.1, 201.2 lie opposite to each other with respect to a first lateral direction 101, which lies parallel to the sectional plane of FIGS. 1 and 2.

Figure 3:
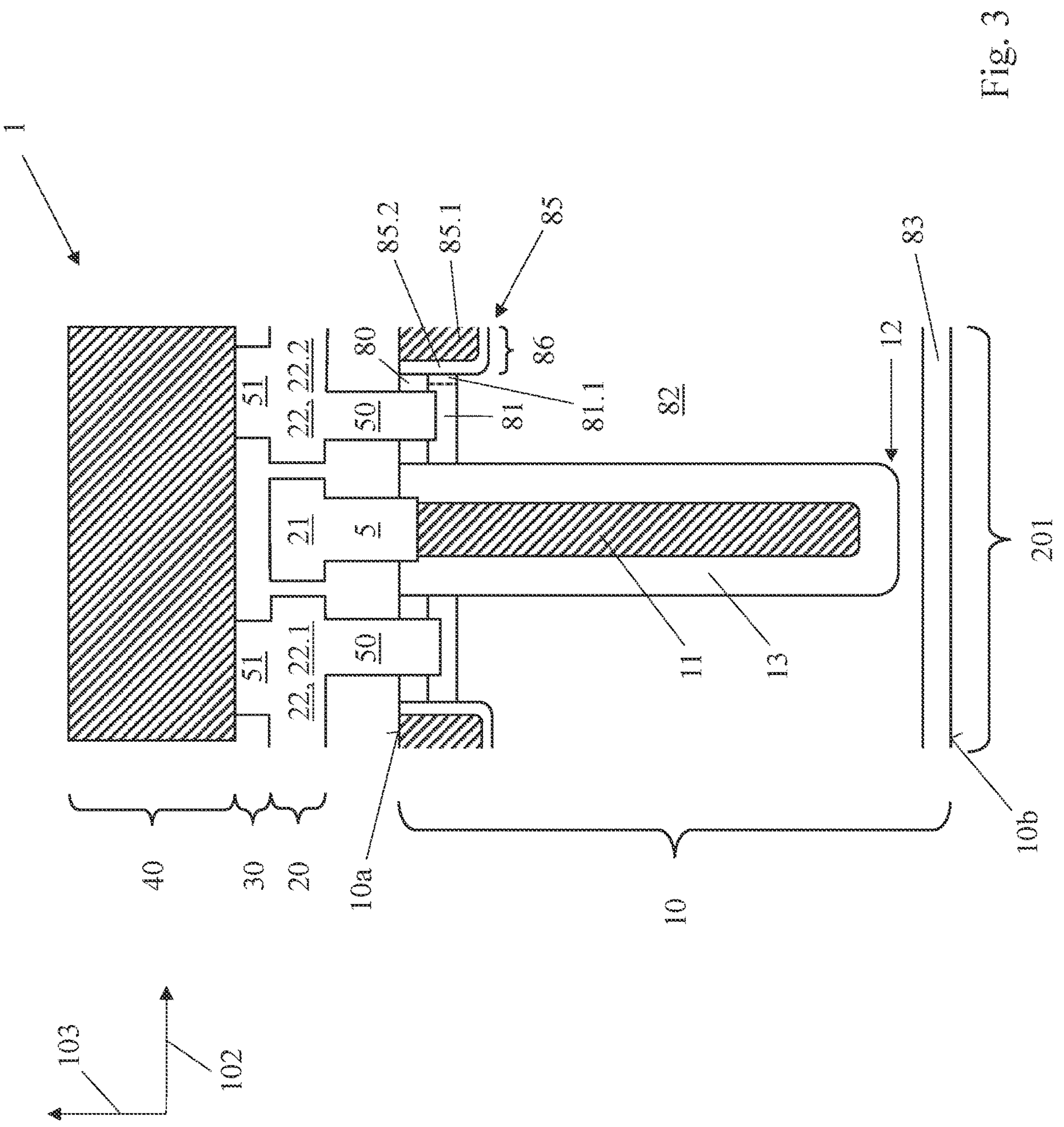
FIG. 3 shows a device cell with field electrode and gate trenches in detail in a cross-sectional view.
Figure 4:
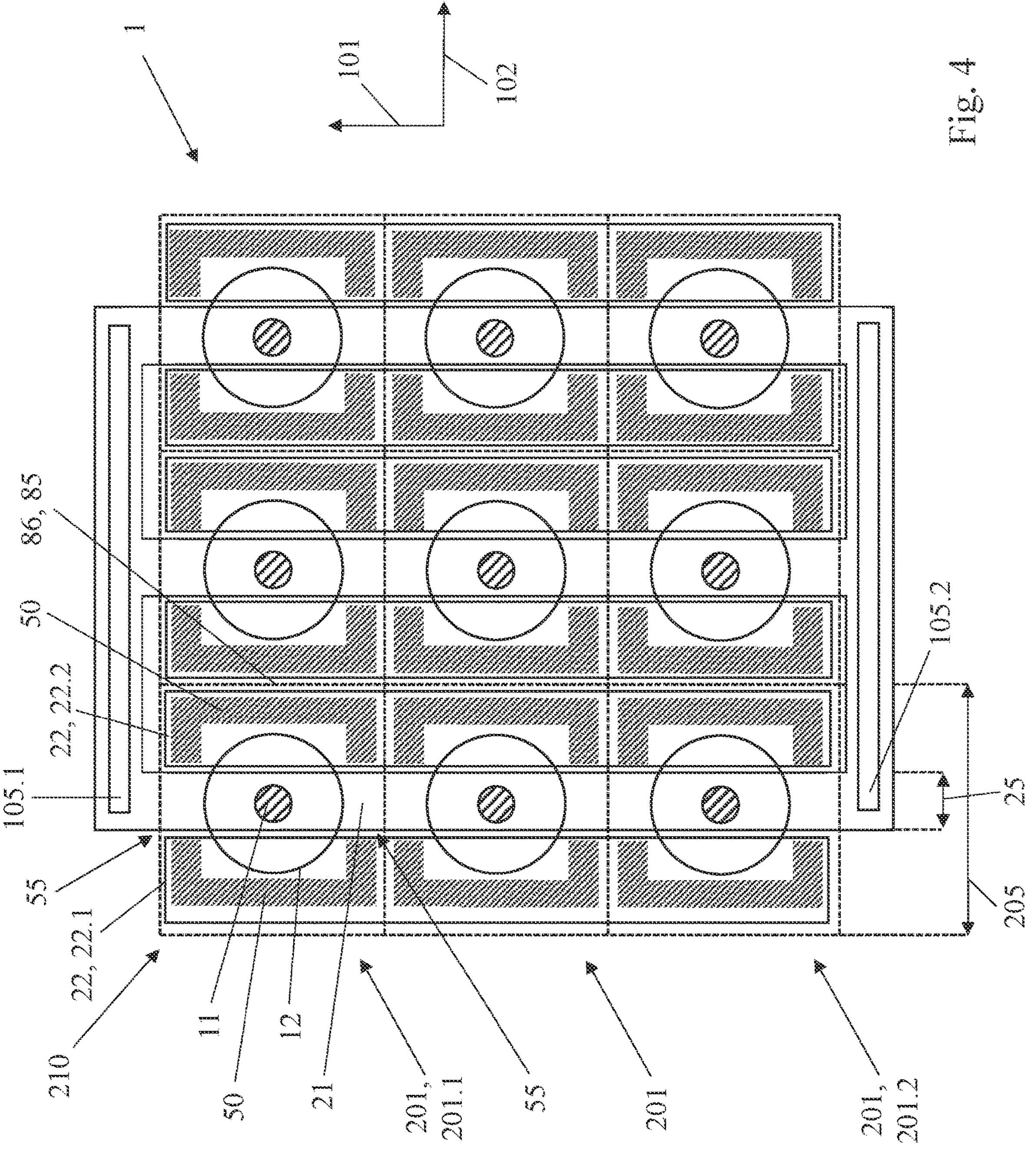
FIG. 4 illustrates a plurality of device cells and the wiring of the field electrodes in a vertical top view.

FIG. 3 illustrates one device cell 201 of the device 1 in a detailed cross-section, the sectional plane lying parallel to the vertical direction 103 and to a second lateral direction 102 (namely perpendicular to the sectional plane of FIGS. 1 and 2, see also FIG. 4 for illustration). The device 1 or device cell 201 comprises a source region 80 and a body region 81, in which a channel region 81.1 is formed adjacent to a gate region 85. The gate region 85 is formed in a gate trench 86 and comprises a gate electrode 85.1 and a gate dielectric 85.2. By applying a voltage to the gate electrode 85.1, a channel path formation in the channel region 81.1 can be controlled.

A drain region 83 of the device 1 is formed at a backside 10*b* of the semiconductor body 10, and a drift region 82 is arranged vertically between the body and the drain region 81, 83. The drift region 82 is made of the same doping type like the drain region 83 but with a lower doping concentration. The drift region 82 and the drain region 83 are both of a first conductivity type, like the source region 80, whereas the body region 81 is of a second conductivity type. In the example shown, the first conductivity type is n-type and the second conductivity type is p-type.

The field electrode trench 12 with the field electrode 11 extends into the drift region 82. The field electrode 11 is contacted via the lower interconnect 5 to the lower metallization layer 20, namely to a first conductor line 21 formed in the lower metallization layer 20. Laterally aside the first conductor line 21, second conductor lines 22 are formed in the lower metallization layer 20, namely a first second conductor line 22.1 and a second second conductor line 22.2.

The second conductor lines 22 are respectively connected to the body and the source region 80, 81 via a respective (lower) body contact 50, and this connection is routed further upwards to the upper metallization layer 40 via respective upper body contacts 51. In the upper metallization layer 40, a large contact plate, e.g. source plate covering the cell field, can be formed, which serves as a source and body connection for any package bonding techniques. Even though the field electrode 11 is connected to the upper metallization layer 40 and the source plate as well, this connection is not formed inside the cell 201 but with the lateral offset.

FIG. 4 illustrates the wiring of a cell field 210 of the device 1 in a vertical top view. In this example, nine device cells 201 are shown for the purpose of illustration, the concept can of course be applied to any cell field comprising a different number of device cells 201. The reference numerals refer mainly to the device cell 201 on the upper left, but the description applies analogously for the remaining cells. Centrally in the device cell 201, the field electrode trench 12 with the field electrode 11 is arranged, the latter connected to the first conductor line 21 in the upper metallization layer via the lower interconnect (not shown here, see FIG. 3 for illustration). The first conductor line 21 has a lateral width 25 smaller than half of a width 205 of the cell. Laterally aside the first conductor line 21 with respect to the second lateral direction 102, the second conductor lines 22 are formed, see FIG. 3 for comparison. The second conductor lines 22 are connected to the source and body region via the body contacts 50.

The body contacts 50 do not surround the field electrode trench 12 completely but are interrupted in interruption regions 55. The first conductor line 21 extends across the device cell 201 in these interruption regions 55.

The first conductor line 21 extends in the first lateral direction 101 across a plurality of device cells 201, three in the example shown, and is electrically connected to each of the field electrodes 11 via a respective lower interconnect above the respective field electrode 11. However, it is not connected to the upper metallization layer in the area of these device cells 201 but extends to a respective location outside the cell field 210. Outside the first outermost one device cell 201.1, the first upper interconnect 105.1 is formed, and the second upper interconnect 105.2 is formed outside a second outermost one device cell 201.2, namely outside the cell field 210 respectively.

The gate trench 86 with the gate region 85 is only shown schematically as a hatched line, it forms a quadratic pattern in this example. Nonetheless, the same concept can also be implemented to a cell field with staggered cells, e.g. a hexagonal cell layout. In this case, e.g. a straight first conducted line could extend in parallel to a direction of a translational symmetry in the cell field, or a curved conductor line could extend obliquely to this direction.

Figure 5:
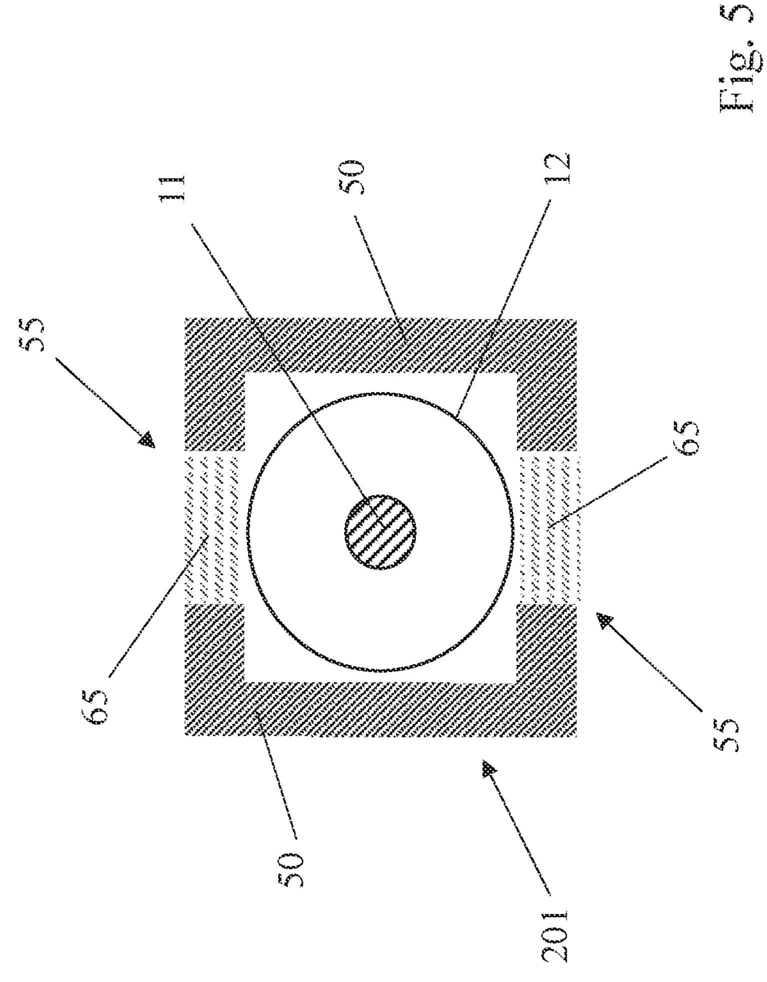
FIG. 5 illustrates some interconnect and implant details for one device cell.

FIG. 5 illustrates a device cell 201 in a more detailed view, illustrating again the interruption regions 55 of the body contact 50. In the area of these interruption regions 55, a respective high dose implant 65 is introduced. It has the same doping type like the body region 81, namely second conductivity type, in particular p-type, but a higher doping concentration. This bridge implant, performed for instance at 150 keV at a dose of $1\times10^{15}$ cm$^{-2}$ $BF_2$, can improve the avalanche robustness of the device, see the detailed description above.

Figure 6:
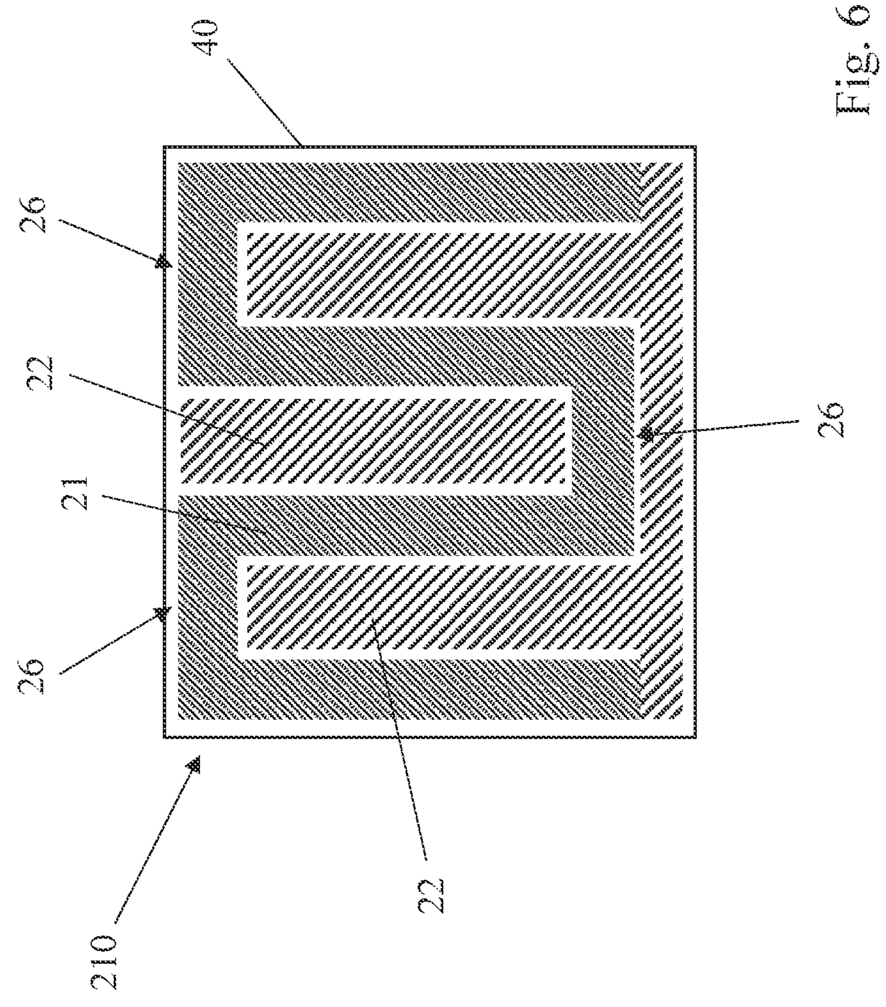
FIG. 6 shows an alternative wiring concept to FIG. 4, with a conductor line in a meandering shape.

FIG. 6 illustrates another wiring concept for a cell field 210, wherein the cells are not shown in detail. In this case, the first conductor line 21 extends with several bends 26 across the cell field, it has a meandering extension (snake like). The first conductor line 21 is electrically connected to the field electrodes below via respective lower interconnects (not shown here), and it is electrically isolated from the upper metallization layer 40 where it has its meandering shape. In other words, no upper interconnects are provided where the first conductor line is illustrated with the narrow crosshatched pattern, instead the upper interconnects are provided in the area of the second conductor lines 22 with the wide crosshatched pattern. The first and the second conductor line 21, 22 are in contact with each other on the lower left and the lower right in FIG. 6, so that the first conductor line 21 is connected to the upper metallization layer 40 via the second conductor line 22.

Figure 7:
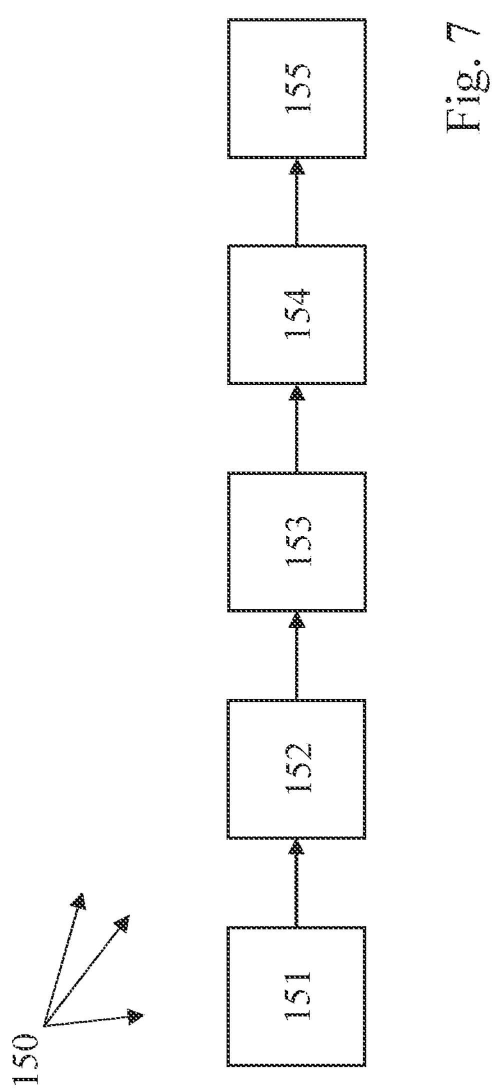
FIG. 7 illustrates some manufacturing steps in a flow diagram.

FIG. 7 summarizes some process steps 150 for manufacturing the device in a flow diagram. After forming 151 the field electrode, the lower metallization layer is formed 152 on the frontside of the semiconductor body. Thereafter, the insulating layer is formed 153, and the upper interconnect is formed 154 subsequently. Finally, the upper metallization layer is formed 155, wherein the formation 154 of the upper interconnect could also be performed simultaneously (not sequentially, as shown in FIG. 7).

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising a field electrode in a needle-shaped field electrode trench extending from a frontside of a semiconductor body into the semiconductor body;

a lower metallization layer on the frontside of the semiconductor body and electrically connected to the field electrode;

an insulating layer on the lower metallization layer;

an upper metallization layer on the insulating layer; and a first interconnect electrically connecting the lower metallization layer to the upper metallization layer, wherein in a top view, the first interconnect is laterally offset from the field electrode trench, such that the lower metallization layer is not physically connected to the upper metallization layer by the first interconnect in a region vertically above the field electrode trench.

2. The semiconductor device of claim 1, wherein the upper metallization layer extends in the region vertically above the field electrode trench and is isolated there from the lower metallization layer by the insulating layer.

3. The semiconductor device of claim 1, wherein the field electrode is arranged in a device cell and the first interconnect is arranged outside of the device cell.

4. The semiconductor device of claim 3, wherein a first conductor line is formed in the lower metallization layer, extending across the device cell, and connected to the field electrode, and wherein the first conductor line has a lateral width smaller than a lateral width of the device cell.

5. The semiconductor device of claim 4, wherein a second conductor line is formed in the lower metallization layer aside the first conductor line, and wherein the second conductor line is electrically connected to a source region and/or a body region of the device cell.

6. The semiconductor device of claim 5, wherein the body region of the device cell, which comprises a channel region and extends, in the top view, around the field electrode, is electrically connected to the second conductor line via a body contact, and wherein the body contact is interrupted in an interruption region vertically below the first conductor line.

7. The semiconductor device of claim 6, wherein a high dose implant region of the interruption region has a same doping type and a higher doping concentration than the body region.

8. The semiconductor device of claim 3, wherein the device cell is one of a plurality of device cells disposed aside each other in a first lateral direction, and wherein the first interconnect is disposed in or laterally outside of a first outermost one of the device cells.

9. The semiconductor device of claim 8, wherein a first conductor line is formed in the lower metallization layer, extending across the plurality of device cells, and connected to the field electrode, wherein the first conductor line has a lateral width smaller than a lateral width of each of the plurality of device cells, and wherein the first conductor line extends across the plurality of device cells.

10. The semiconductor device of claim 9, wherein the insulating layer extends as a continuous layer across the plurality of device cells and isolates the first conductor line from the upper metallization layer.

11. The semiconductor device of claim 9, wherein the first conductor line extends with curves and/or bends across the plurality of device cells.

12. The semiconductor device of claim 11, wherein the first conductor line extends across the plurality of device cells in a meandering shape.

13. The semiconductor device of claim 1, wherein the lower metallization layer is made of tungsten.

14. A method for manufacturing a semiconductor device, the method comprising:

forming a field electrode in a needle-shaped field electrode trench extending from a frontside of a semiconductor body into the semiconductor body;

forming a lower metallization layer on the frontside of the semiconductor body and electrically connected to the field electrode;

forming an insulating layer on the lower metallization layer;

forming an upper metallization layer on the insulating layer; and forming a first interconnect electrically connecting the lower metallization layer to the upper metallization layer, wherein in a top view, the first interconnect is laterally offset from the field electrode trench, such that the lower metallization layer is not physically connected to the upper metallization layer by the first interconnect in a region vertically above the field electrode trench.

15. The method of claim 14, further comprising:

forming a first conductor line in the lower metallization layer that extends across a device cell of the semiconductor device and is connected to the field electrode, wherein the first conductor line has a lateral width smaller than a lateral width of the device cell; and simultaneously forming with the first conductor line a gate conductor line that electrically contacts a gate region of the semiconductor device.

16. The method of claim 15, further comprising:

forming a second conductor line in the lower metallization layer aside the first conductor line; and electrically connecting the second conductor line to a source region and/or a body region of the semiconductor device.

17. The method of claim 16, further comprising:

electrically connecting the body region of the device cell, which comprises a channel region and extends, in the top view, around the field electrode, to the second conductor line via a body contact; and interrupting the body contact in an interruption region vertically below the first conductor line.

18. The method of claim 17, further comprising:

forming a high dose implant region in the interruption region, wherein the high dose implant region has a same doping type and a higher doping concentration than the body region.

19. The method of claim 14, further comprising:

forming a first conductor line in the lower metallization layer and extending across a plurality of device cells of the semiconductor device, the first conductor line having a lateral width smaller than a lateral width of the plurality of device cells; and electrically connecting the first conductor line to the field electrode.

* * * * *